United States Patent [19]
Lee

[11] Patent Number: 5,978,247
[45] Date of Patent: Nov. 2, 1999

[54] LAYOUT FOR A SEMICONDUCTOR MEMORY DEVICE HAVING A TRIPLE WELL STRUCTURE

[75] Inventor: Jung-Hwa Lee, Kyunggi-do, Rep. of Korea

[73] Assignee: Samsung Electronics Co., Ltd., Rep. of Korea

[21] Appl. No.: 09/186,026

[22] Filed: Nov. 4, 1998

[30] Foreign Application Priority Data

Nov. 20, 1997 [KR] Rep. of Korea ................ 97-61347

[51] Int. Cl.⁶ .................................................. G11C 5/06
[52] U.S. Cl. ...................... 365/63; 365/51; 365/189.09
[58] Field of Search .................... 365/51, 63, 149, 365/189.09

[56] References Cited

U.S. PATENT DOCUMENTS

| | | | |
|---|---|---|---|
| 5,388,084 | 2/1995 | Itoh et al. | 365/189.09 |
| 5,397,734 | 3/1995 | Iguchi et al. | 437/70 |
| 5,650,972 | 7/1997 | Tomishima et al. | 365/63 |
| 5,652,726 | 7/1997 | Tsukude et al. | 365/63 |
| 5,822,238 | 10/1998 | Okubo | 365/63 |

Primary Examiner—Son T. Dinh
Attorney, Agent, or Firm—Myers Bigel Sibley & Sajovec

[57] ABSTRACT

A layout for a semiconductor memory device with a triple well structure, comprises a plurality of memory cell regions arranged in a matrix, a plurality of first circuit regions respectively arranged between adjacent ones of the memory cell regions along the first direction and each having the circuits to code and drive the word lines of corresponding memory cell region, a plurality of second circuit regions respectively arranged between adjacent ones of the memory cell regions in the second direction perpendicular to the first direction and each having the circuit to sense the bit line of corresponding bit line, a plurality of third circuit regions respectively arranged between adjacent ones of the first and second circuit regions, first drive elements applied with at least two well-bias voltages to drive the circuits of the first circuit regions, and second drive elements applied with another well-bias voltage to drive the circuit of the second circuit regions, wherein the first and second drive elements are respectively arranged in two adjacent ones of the third circuit regions.

4 Claims, 7 Drawing Sheets

LAYOUT FOR A SEMICONDUCTOR MEMORY DEVICE HAVING A TRIPLE WELL STRUCTURE

FIELD OF THE INVENTION

The present invention concerns a semiconductor device, and more particularly a layout for a dynamic random access memory (DRAM) with a triple well structure.

BACKGROUND OF THE INVENTION

When fabricating a DRAM on a p-type substrate, there are frequently formed the n-channel MOS transistors of the memory cell regions and the n- and p-channel MOS transistors of the peripheral circuit regions in other well tubs. This has the following advantages: first, the memory cell regions are not affected by the noises induced in the peripheral circuit regions; second, the substrate bias of the memory cell regions may be controlled independently of the peripheral circuit region; third, the short-channel effect of the peripheral circuit region may be readily controlled; fourth, the substrate voltage generator circuit may be made more small.

However, it is required that the p-well of the memory cell region should be separated from the p-type silicon substrate in order to form the n-channel MOS transistors of the memory cell regions and the n- and p-channel MOS transistors of the peripheral circuit regions in the other wells, so that there must needs be formed the n-wells deeper than the p-wells of the memory cell regions, and thus to cover them. This results in the triple well structure, as disclosed in U.S. Pat. No. 5,397,734 entitled "Method of Fabricating a Semiconductor Memory Device Having a Triple Well Structure".

FIG. 1 illustrates the general structure of a DRAM made of hierarchical word lines or sub-word lines. This includes a plurality of memory cell regions 10, a plurality of sub-word line decoders (SWDs) 21 respectively arranged in the regions 20 between adjacent memory cell regions 10 in the word line direction, and a plurality of sense amplifiers (SAs) 32 respectively arranged in the regions 30 between the memory cell regions 10 in the direction of the bit lines (not shown), through which a memory cell is selected to sense its data by means of SA. The drive circuits (DRVs) for supplying a voltage source and decoding signals Pxj to the above regions 20 and 30 are arranged in the DRV regions 40 between the SWD regions 20 and SA regions 30. One of them is the first drive circuit 41 to drive the decoding signals PXID and PXIB of different levels VPP and VINT to corresponding SWD 21, and the other the second drive circuit 42 to supply a source voltage to the P- and N-latch sense amplifiers 33 and 34 as shown in FIG. 2A.

FIG. 2A is a circuit diagram for illustrating a drive circuit of the P-latch SA conventionally used in DRAM, and FIG. 2B a drive circuit of a conventional SWD used n DRAM. FIG. 3A is a plane view for illustrating the structure of the twin well, and FIG. 3B a cross sectional view taken along line 3–3' in FIG. 3A. As shown in the drawings, DRAM using the p-type semiconductor substrate 1 comprises NMOS transistors in the p-type substrate 1 and PMOS transistors in the n-well in the SA region 30, where ground voltage VSS is applied as the well bias voltage of the transistors constituting the N-latch SA 34 of the SA 32, and the internal voltage VINT as the well bias voltage of the PMOS transistors. In this case, the SA region 30 may be laid out by means of the twin well structure, as shown in FIGS. 3A and 3B.

Referring to FIG. 1, the drive circuits 41 and 42 of SWD and SA are arranged together in the DRV region 40, where at least two wells are required because the decoding signal Pxj is driven by two voltage sources, for example, VPP and VINT due to the inverter circuits IV1, IV2 and IV3 constituting the SWD drive circuit 41. Namely, the PMOS transistors of the inverter circuits IV1, IV2 and IV3 are separately arranged both in the n-well biased by the voltage VPP and in the n-well biased by the voltage VINT. Additionally required are at least two n-wells for the PMOS transistors applied with a different well-bias source voltage. In this respect, it is substantially impossible to arrange the drive circuits 41 and 42 in the region 40 defined by the SWD region 20 and SA region 30, as shown in FIG. 1. Namely, after determining the space W between the wells and the space S between the boundary of the element active region and the boundary of the well, it is impossible to form the PMOS transistors in the remaining DRV region A(=L−2*[S+W+S'+W'], where L is the width of SWD, as shown in FIG. 6A). In order to cope with this problem, it has been proposed to reduce the size of the SWD and SA drive elements arranged in the DRV region 40 or to arrange them in the external region except the cell region 10. However, this proposition degrades the capacity of the drive elements or lowers the operational speed due to the delay time inhering in the signal lines connecting the external drive circuit with the internal SA or SWD. Or otherwise, the DRV region 40 may be increased to resolve such problem, but this results in increase of the chip size.

SUMMARY OF THE INVENTION

It is an object of the present invention to provide a layout of a semiconductor device which prevents increase of the chip size and lowering of the data transfer speed in the triple well construction.

According to an embodiment of the present invention, a layout for a semiconductor memory device with a triple well structure, comprises a plurality of memory cell regions arranged in a matrix, a plurality of first circuit regions respectively arranged between adjacent ones of the memory cell regions along the first direction and each having the circuits to code and drive the word lines of corresponding memory cell region, a plurality of second circuit regions respectively arranged between adjacent ones of the memory cell regions in the second direction perpendicular to the first direction and each having the circuit to sense the bit line of corresponding bit line, a plurality of third circuit regions respectively arranged between adjacent ones of the first and second circuit regions, first drive elements applied with at least two well-bias voltages to drive the circuits of the first circuit regions, and second drive elements applied with another well-bias voltage to drive the circuit of the second circuit regions, wherein the first and second drive elements are respectively arranged in two adjacent ones of the third circuit regions.

The present invention will now described more specifically with reference to the drawings attached only by way of examples.

BRIEF DESCRIPTION OF THE ATTACHED DRAWINGS

Figure 3A:
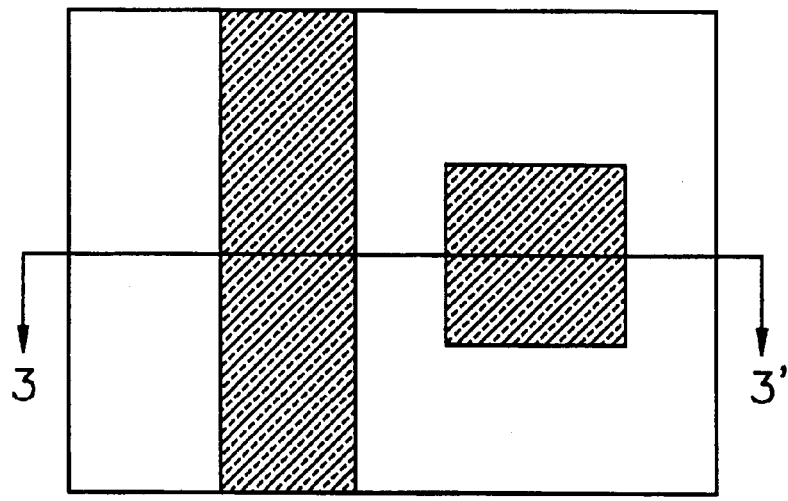
FIG. 3A is a plane view for illustrating the structure of the twin well.
Figure 3B:
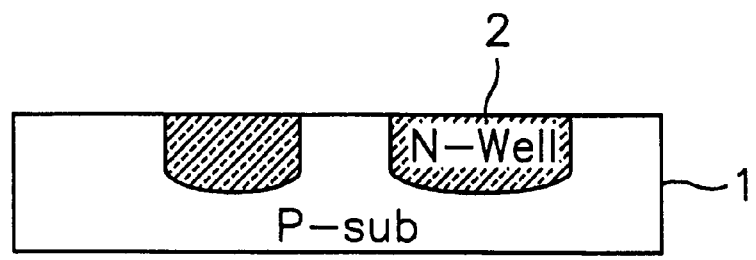
Figure 4:
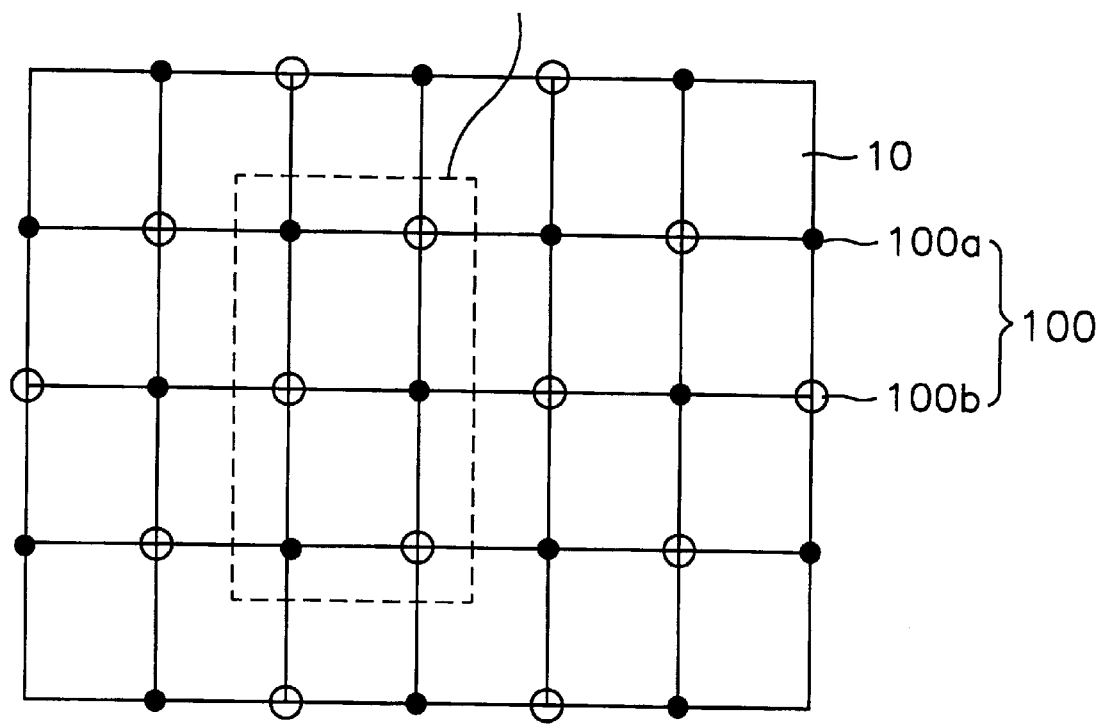
Figure 5:
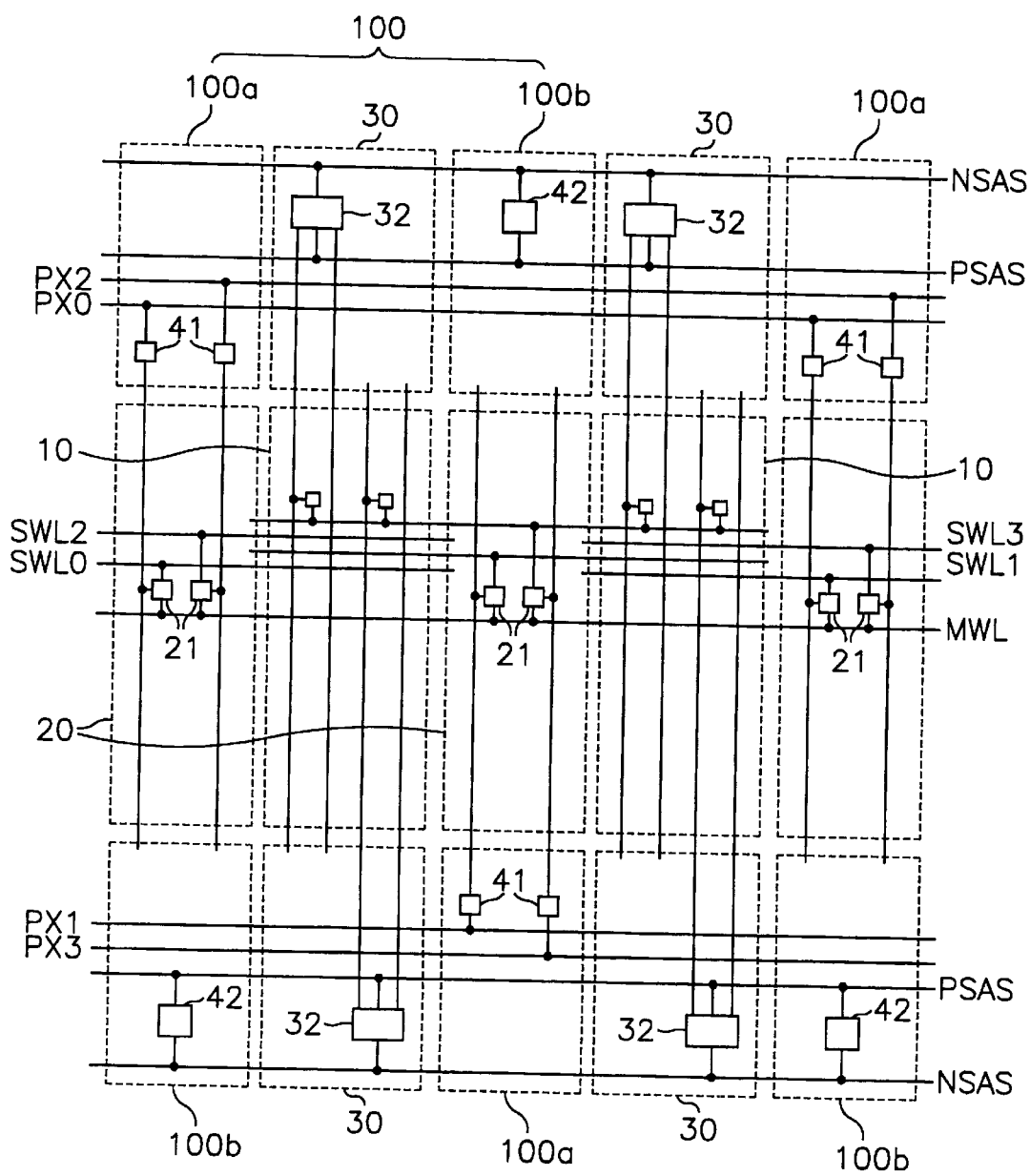
Figure 6A:
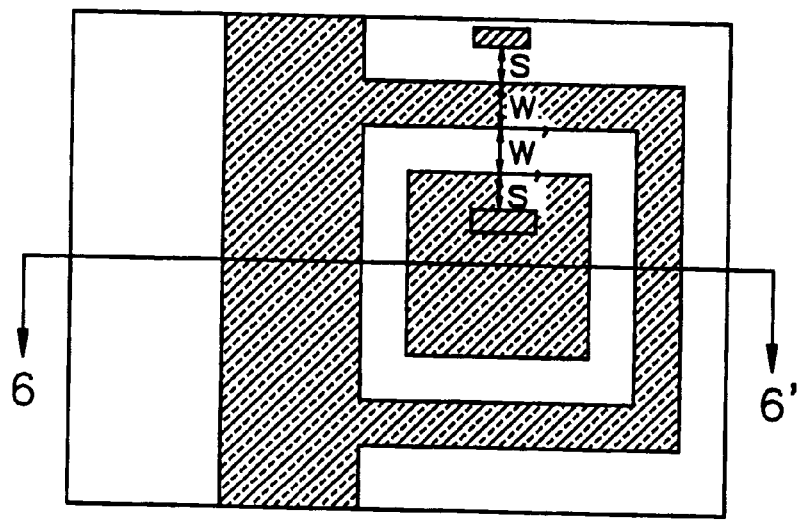
Figure 6B:
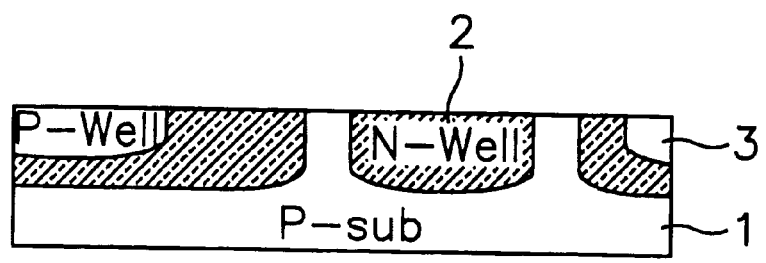
Figure 7A:
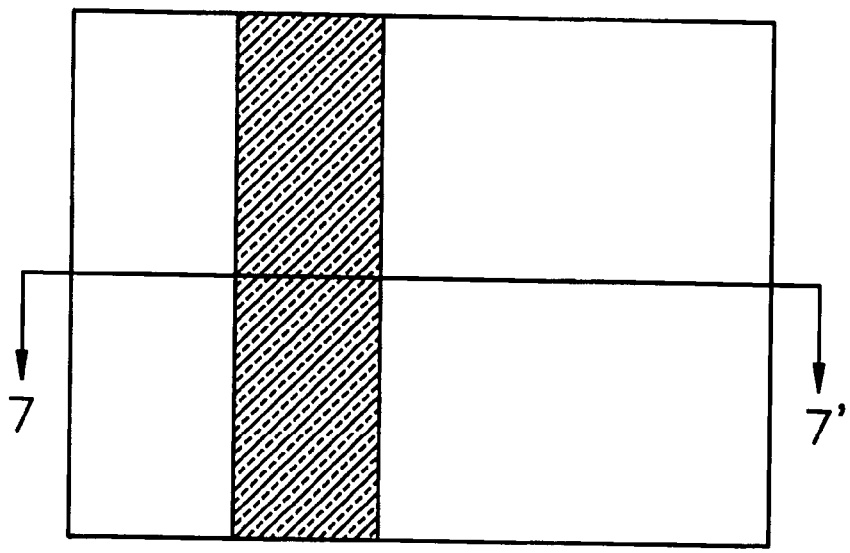
Figure 7B:
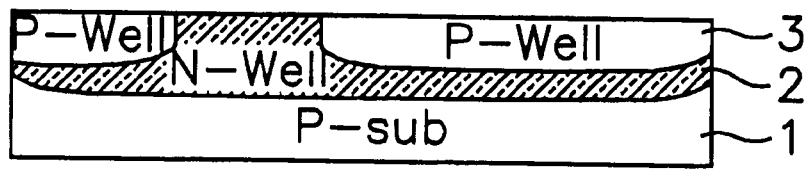

FIG. 3B a cross sectional view taken along line 3–3' in FIG. 3A;

FIG. 4 is a block diagram for illustrating arrangement of the DRV regions according to the present invention;

FIG. 5 is a block diagram for illustrating the structure of DRAM by enlargement of the portion enclosed by dotted lines in FIG. 4;

FIG. 6A is a plane view for illustrating the layout of the DRV region for the SWD drive circuit of FIG. 5 in DRAM with the triple well structure according to the present invention;

FIG. 6B is a cross sectional view taken along line 6–6' in FIG. 6A;

FIG. 7A is a plane view for illustrating the layout of the DRV region for the P-latch SA drive circuit of FIG. 5 in DRAM with the triple well structure according to the present invention; and FIG. 7B is a cross sectional view taken along line 7–7' in FIG. 7A

DETAILED DESCRIPTION OF THE PREFERRED EMBODIMENTS

Referring to FIG. 5, the DRV regions 100 arranged between the SWD regions 20 and SA regions 30 consist of two parts 100a and 100b for arranging a plurality of PMOS transistors to supply the decoding signal Pxj and voltage source VINT to the circuits of the SWD regions 20 and SA regions 30. In this case, the first PMOS transistors applied with at least two well bias voltages, e.g., VPP and VINT are exclusively arranged in the DRV region 100a while the second PMOS transistors applied with a well bias voltage, e.g., VINT is exclusively arranged in the DRV region 100b. As shown in FIG. 5, the DRV regions 100a and 100b are arranged zigzag with regard to the memory cell region 10. Accordingly, this prevents the increase of the chip size due to the increase of the DRV region 100. In addition, there is prevented the signal delay which has been induced by the conventional drive circuits arranged in the outside of the memory cell regions 10.

Referring to FIG. 4, symbols ● and ○ represent the DRV regions 100a and 100b provided with the PMOS transistors for applying the decoding signal Pxj and voltage source VINT to the circuits of the SWD and SA regions. Symbol ● represents the DRV region 100a corresponding to the SWD region 20 applied with at least two well bias voltages while symbol ○ represents the DRV region 100b corresponding to the SA region 30 applied with a different well bias voltage. These two kinds of DRV regions 100a and 100b are arranged zigzag with regard to the memory cell regions, as shown in FIG. 4. Namely, the two DRV regions are alternately arranged in rows and columns.

As the semiconductor memory device is highly integrated, DRAM with the triple well structure suffers increase of the space between the wells, reducing the space for arranging the PMOS transistors for the SWD and SA in the limited DRV region. Consequently, it is substantially impossible to arrange the PMOS transistors for applying the decoding signals Pxj of different levels VPP and VINT and voltage source VINT to the SWD and SA regions 20 and 30 in the same DRV region 40 according to the conventional arrangement, for there are increased the space between the wells and the space between the boundary of the element active region and the boundary of the well in the triple well structure.

Figure 1:
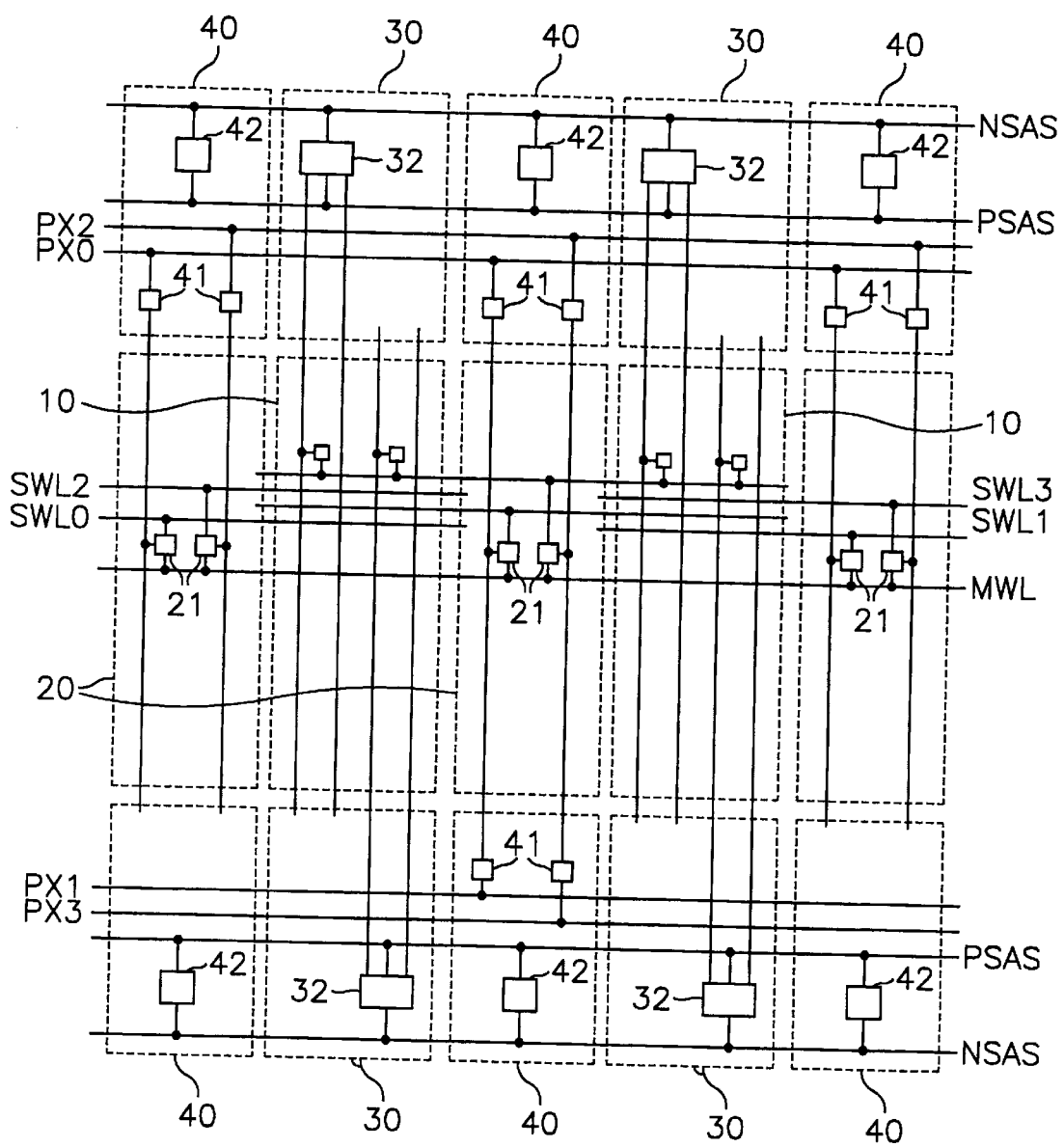
FIG. 1 illustrates the general structure of a DRAM made of sub-word lines.
Figure 2A:
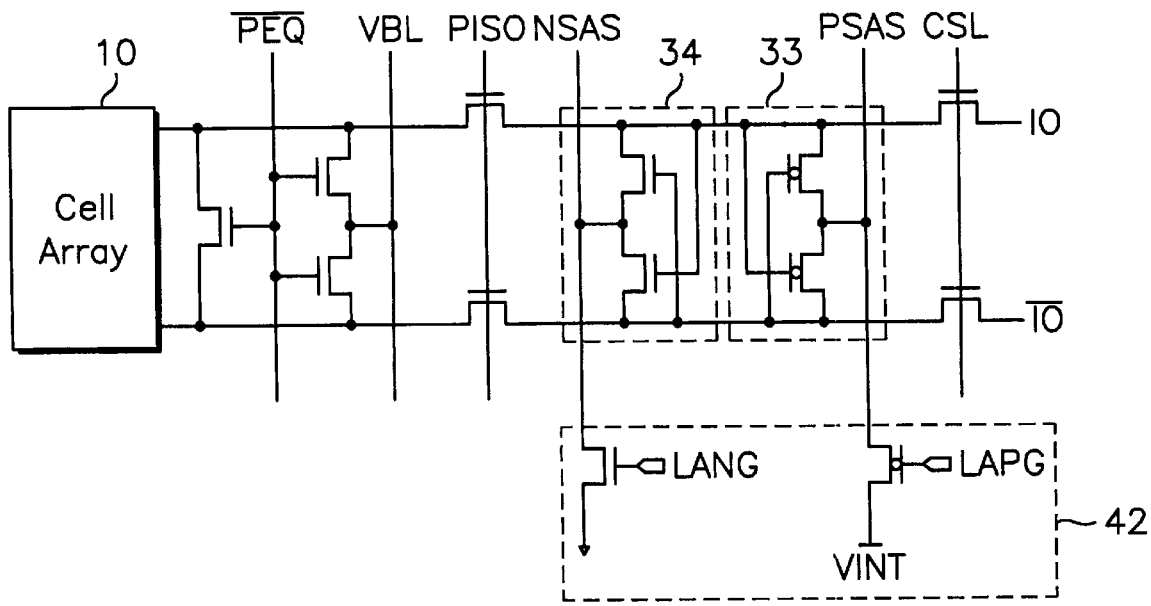
FIG. 2A is a circuit diagram for illustrating SA and a drive circuit of the P-latch SA conventionally used in DRAM.
Figure 2B:
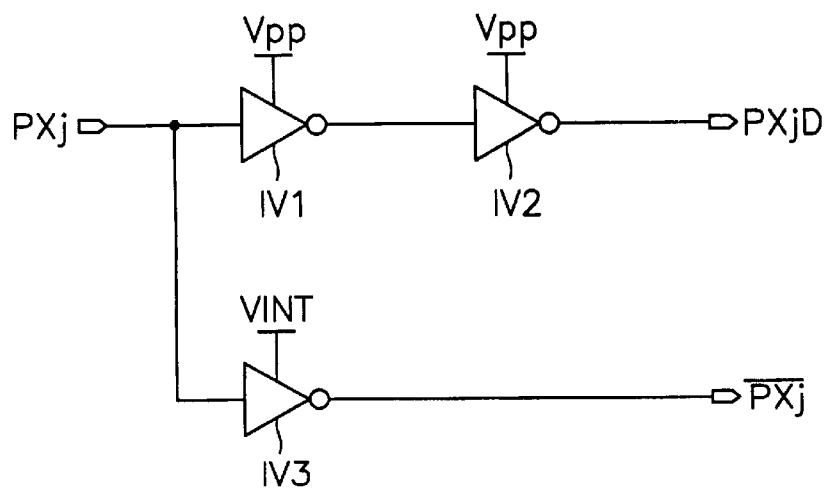
FIG. 2B illustrates a drive circuit of a conventional SWD used in DRAM.

However, according to the inventive layout, the drive region 100a is exclusively provided with at least two circuits (SWD drive circuit 41 as shown in FIG. 2B) including the PMOS transistors for supplying two different well bias voltages VPP and VINT while the DRV region 100b is exclusively provided with the circuit (P-latch SA drive circuit 42 as shown in FIG. 2B) including the PMOS transistors for supplying a well bias voltage VINT, as shown in FIG. 5. Hence, the PMOS transistors for supplying two different well bias voltages are disposed in the separate n-wells 2 of a single DRV region 100a, as shown in FIGS. 6A and 6B, so that the element active region for arranging the transistors is considerably increased compared to the conventional layout. Namely, the conventional layout has the same DRV region 40 provided with both drive circuits 41 and 42 for respectively driving the SWD and SA while the inventive layout has two different DRV regions 100a and 100b respectively provided with the SWD drive circuit 41 and SA drive circuit 42. This prevents the increase of the chip size due to the elements arranged in the DRV region in DRAM with the triple well structure.

Referring to FIGS. 7A and 7B, there is shown the PMOS transistor arranged in an n-well of the DRV region 100b, where a P-latch SA drive circuit is provided. The two kinds of DRV regions 100a and 100b are alternately arranged in rows and columns, as shown in FIG. 5. Namely, the same functional DRV regions 100a or 100b are not arranged adjacent to each other. Meanwhile, since the DRV region 100b only includes the n-well 2 for a single PMOS transistor with no PMOS transistors having different well bias voltages, differing from the well structure of FIGS. 6A and 6B, it is possible to effectively arrange the peripheral control circuits. Moreover, since the element active region is considerably increased, as shown in FIGS. 7A and 7B, the DRV region 100b may be provided with a PMOS transistor having more enhanced capacity compared to the conventional one, thus preventing the P-latch SA drive circuit 42 from being degraded.

What is claimed is:

1. A layout for a semiconductor memory device with a triple well structure, comprising:

a plurality of memory cell regions arranged in a matrix;

a plurality of first circuit regions respectively arranged between adjacent ones of said memory cell regions along the first direction and each having the circuits to code and drive the word lines of corresponding memory cell region;

a plurality of second circuit regions respectively arranged between adjacent ones of said memory cell regions in the second direction perpendicular to said first direction and each having the circuit to sense the bit line of corresponding bit line;

a plurality of third circuit regions respectively arranged between adjacent ones of said first and second circuit regions;

first drive elements applied with at least two well-bias voltages to drive the circuits of said first circuit regions; and second drive elements applied with another well-bias voltage to drive the circuit of said second circuit regions, wherein said first and second drive elements are respectively arranged in two adjacent ones of said third circuit regions.

2. A layout as defined in claim 1, wherein said first and second drive elements include PMOS transistors.

3. A layout as defined n claim 2, wherein the third circuit regions provided with said first drive elements are disposed zigzag with regard to the first circuit regions in said first or second direction, and thus those with said second drive elements.

4. A layout as defined in claim 1, wherein said another well-bias voltage applied to said second drive elements has the same level as one of said at least two well-bias voltages applied to said first drive elements.

\* \* \* \* \*